United States Patent
Park et al.

(10) Patent No.: US 12,514,104 B2
(45) Date of Patent: Dec. 30, 2025

(54) DISPLAY DEVICE HAVING BENDABLE PORTION

(71) Applicant: SAMSUNG DISPLAY CO., LTD., Yongin-si (KR)

(72) Inventors: Hyung-Gyu Park, Seoul (KR); Soo Hee Oh, Hwaseong-si (KR); Seong Geun Won, Hwaseong-si (KR); Hirotsugu Kishimoto, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

(21) Appl. No.: 18/301,978

(22) Filed: Apr. 17, 2023

(65) Prior Publication Data

US 2023/0255099 A1    Aug. 10, 2023

Related U.S. Application Data

(63) Continuation of application No. 17/011,962, filed on Sep. 3, 2020, now Pat. No. 11,631,823, which is a continuation of application No. 15/406,252, filed on Jan. 13, 2017, now Pat. No. 10,770,666.

(30) Foreign Application Priority Data

Feb. 4, 2016    (KR) .................. 10-2016-0014405

(51) Int. Cl.
*H10K 77/10*    (2023.01)
*H10K 59/80*    (2023.01)
*H10K 102/00*    (2023.01)

(52) U.S. Cl.
CPC ......... *H10K 77/111* (2023.02); *H10K 59/873* (2023.02); *H10K 2102/311* (2023.02); *Y02E 10/549* (2013.01)

(58) Field of Classification Search
CPC .. H10K 50/844; H10K 59/873; H10K 77/111; H10K 2102/311; Y02E 10/549
See application file for complete search history.

(56) References Cited

U.S. PATENT DOCUMENTS

| | | |
|---|---|---|
| 9,203,050 B2 | 12/2015 | Jeong et al. |
| 9,614,167 B2 | 4/2017 | Jeong et al. |
| 10,038,161 B2 | 7/2018 | Jeong et al. |
| 10,770,666 B2 | 9/2020 | Park et al. |
| 11,145,838 B2 | 10/2021 | Jeong et al. |
| 2012/0307191 A1 | 12/2012 | Park et al. |
| 2013/0002569 A1 | 1/2013 | Kang et al. |
| 2014/0152174 A1 | 6/2014 | Wang et al. |

(Continued)

FOREIGN PATENT DOCUMENTS

| | | |
|---|---|---|
| JP | 2015-004711 A | 1/2015 |
| KR | 10-2012-0034506 | 4/2012 |

(Continued)

*Primary Examiner* — Suberr L Chi
(74) *Attorney, Agent, or Firm* — Womble Bond Dickinson (US) LLP

(57) ABSTRACT

A display device includes a flexible display panel and a protective film. The protective film includes a film main body and a first adhesion portion. The film main body has a first surface contacting the flexible display panel and a first recess portion recessed from the first surface, and the first adhesion portion is in the first recess portion.

18 Claims, 6 Drawing Sheets

(56) References Cited

U.S. PATENT DOCUMENTS

| | | | |
|---|---|---|---|
| 2014/0152912 A1 | 6/2014 | Lee et al. | |
| 2014/0346451 A1 | 11/2014 | Oh | |
| 2015/0024170 A1 | 1/2015 | Min et al. | |
| 2015/0102296 A1 | 4/2015 | Kim et al. | |
| 2016/0014883 A1 | 1/2016 | Cho et al. | |
| 2016/0062018 A1* | 3/2016 | Namkung | H10K 50/844 |
| | | | 359/489.07 |
| 2016/0084994 A1 | 3/2016 | Namkung | |
| 2016/0139453 A1 | 5/2016 | Yui et al. | |
| 2016/0254328 A1 | 9/2016 | Song | |
| 2016/0336523 A1 | 11/2016 | Kwon et al. | |
| 2016/0343964 A1 | 11/2016 | Kwon | |
| 2017/0003737 A1 | 1/2017 | Wang et al. | |
| 2017/0192140 A1 | 7/2017 | Yoon et al. | |
| 2017/0199544 A1 | 7/2017 | Choi et al. | |

FOREIGN PATENT DOCUMENTS

| | | |
|---|---|---|
| KR | 10-2013-0008096 A | 1/2013 |
| KR | 10-2013-0106731 | 9/2013 |
| KR | 10-2014-0100090 | 8/2014 |
| KR | 10-2014-0136762 A | 12/2014 |
| KR | 10-2015-0078562 | 7/2015 |

\* cited by examiner

DISPLAY DEVICE HAVING BENDABLE PORTION

CROSS-REFERENCE TO RELATED APPLICATIONS

This application is a continuation of U.S. patent application Ser. No. 17/011,962, filed Sep. 3, 2020, which is a continuation of U.S. patent application Ser. No. 15/406,252, filed Jan. 13, 2017, now U.S. Pat. No. 10,770,666, which claims priority to and the benefit of Korean Patent Application No. 10-2016-0014405, filed Feb. 4, 2016, the entire content of all of which is incorporated herein by reference.

BACKGROUND

1. Field

Aspects of the described technology relate generally to a display device.

2. Description of the Related Art

As a device for displaying an image (e.g., a display device), an organic light emitting display device that includes an organic light emitting element has been used as a display device.

In general, the organic light emitting display device includes a substrate, an organic light emitting element provided on the substrate, and a sealing portion (e.g., a sealant) that seals the substrate and the organic light emitting element.

Recently, a flexible organic light emitting display device that includes a flexible substrate including an organic material and that is partially bendable has been researched and developed.

Such a flexible organic light emitting device may further include a protective film attached to a bottom surface of the flexible substrate to suppress breakage due to external interference.

The above information disclosed in this Background section is for enhancement of understanding of the background of the described technology, and therefore, it may contain information that does not form prior art.

SUMMARY

Aspects of the described technology have been made in an effort to provide a display device including a protective film while having improved flexibility.

Further aspects of the present invention provide a display device in which a location of a neutral plane may be controlled (e.g., selectively controlled) by using and/or modifying a protective film thereof.

An embodiment of the present invention provides a display device including a flexible display panel and a protective film. The protective film includes a film main body and a first adhesion portion. The film main body has a first surface contacting the flexible display panel and a first recess portion recessed from the first surface, and the first adhesion portion is in the first recess portion.

The first adhesion portion may be between the flexible display panel and the film main body.

The first adhesion portion may be bonded with the film main body and the flexible display panel.

The first adhesion portion may have a smaller Young's modulus than that of the film main body.

The film main body may have a plurality of the first recess portions, and the plurality of first recess portions may be spaced from each other in a first direction on the first surface of the film main body.

The flexible display panel and the protective film may be bent in the first direction.

Each of the plurality of first recess portions may extend in a second direction that crosses the first direction.

The first surface of the film main body may not be bonded with the flexible display panel.

The film main body may have a second surface opposite the first surface and a second recess portion recessed from the second surface, and the protective film may further include a second adhesion portion in the second recess portion.

The second adhesion portion may have a smaller Young's modulus than that of the film main body.

The film main body may have a plurality of the second recess portions, and the plurality of second recess portions may be spaced from each other in a first direction on the second surface of the film main body.

Each of the plurality of second recess portions may extend in a second direction that crosses the first direction.

The second recess portion may partially overlap the first recess portion in a thickness direction of the film main body.

A cross-section of at least one of the first recess portion and the second recess portion may have a triangular shape, a quadrangular shape, a hexagonal shape, a polygonal shape, a circular shape, or an oval shape.

A thickness of the protective film may be greater than a thickness of the flexible display panel.

The display device may further include a polarizer on the protective film with the flexible display panel between the polarizer and the protective film and a window on the polarizer.

The display device may further include: a first adhesion layer between the flexible display panel and the polarizer; and a second adhesion layer between the polarizer and the window.

The flexible display panel may include a flexible substrate contacting the first surface of the film main body and an organic light emitting element on the flexible substrate.

The flexible display panel may further include a flexible display substrate, a thin film layer on the flexible display substrate, and an organic light emitting element between the flexible display substrate and the thin film layer.

According to exemplary embodiments of the present invention, the flexibility of the display device including the protective film may be improved.

Further, according to exemplary embodiments of the present invention, a location of a neutral plane in the display device is controlled by using (e.g., by modifying) the protective film.

DETAILED DESCRIPTION

Figure 1:
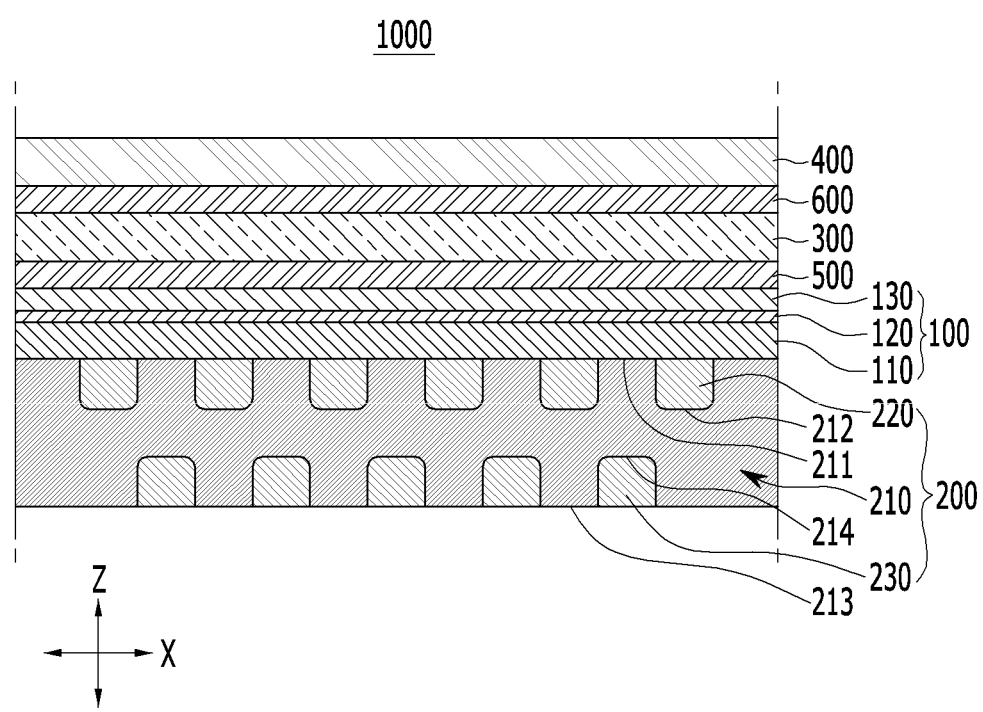
FIG. 1 is a cross-sectional view of a part of a display device according to an exemplary embodiment.

The present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Further, throughout the specification, the word "on" and variations thereof indicate positioning on or below the object portion and a not limited to positioning on the upper side of the object portion based on a gravitational direction. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In addition, the size and thickness of the various elements, components, and configurations shown in the drawings may be arbitrarily shown for understanding and ease of description, and the present invention is not limited thereto.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. In addition, unless explicitly described to the contrary, the words "include" and "comprise" and variations thereof, such as "includes," "including," "comprises," and "comprising," will be understood to imply the inclusion of stated elements but not the exclusion of any other elements. Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Hereinafter, a display device according to an exemplary embodiment of the present invention will be described with reference to FIGS. 1 and 2. Herein, an organic light emitting display device will be described as an example of the display device. However, the present invention is not limited thereto, and the display device according to other exemplary embodiments may include any suitable flexible display panel for displaying an image. In such embodiments, the display device may be one of various suitable displays, such as a liquid crystal display (LCD), an electrophoretic display (EPD), an electrowetting display (EWD), and the like.

FIG. 1 is a cross-sectional view of a part (e.g., a bendable portion) of a display device according to an exemplary embodiment.

As shown in FIG. 1, a display device 1000 according to an exemplary embodiment includes a flexible display panel 100, a protective film 200, a polarizer 300, a window 400, a first adhesive layer 500, and a second adhesive layer 600.

The flexible display panel 100 includes a flexible substrate 110, an organic light emitting element 120, and a thin film encapsulation layer 130.

The flexible substrate 110 may be a film including, as an example, an organic material. However, the present invention is not limited thereto. In other embodiments, the flexible substrate 110 may include an insulation substrate that includes (e.g., is made of) glass. A driving layer including a plurality of thin film transistors that are connected with the organic light emitting element 120 may be disposed on the flexible substrate 110, and the driving layer may have various known, suitable structures. The flexible substrate 110 contacts the protective film 200. For example, the flexible substrate 110 contacts a first surface 211 of a film main body 210 of the protective film 200 and also contacts (e.g., concurrently or simultaneously contacts) a first adhesion portion 220 (e.g., a first adhesive) of the protective film 200. For example, the flexible substrate 110 contacts (e.g., directly contacts) the first adhesion portion 220 while directly contacting the first surface 211 of the film main body 210.

The organic light emitting element 120 is disposed on the flexible substrate 110 (e.g., on a surface of the flexible substrate 110 opposite another surface contacting the protective film 200). The organic light emitting element 120 includes a plurality of electrodes (e.g., two electrodes) that are disposed facing each other and an organic emission layer provided between adjacent ones of the electrodes (e.g., between the two electrodes). The organic emission layer is configured to emit light. One or more of the electrodes (e.g., one or more of the two electrodes) may be a light transflective or light transmissive electrode. Light emitted by the organic emission layer may pass through the light transflective or light transmissive electrode. The organic light emitting element 120 may have various known, suitable structures.

The thin film encapsulation layer 130 is disposed on the flexible substrate 110 such that the organic light emitting element 120 is interposed between the thin film encapsulation layer 130 and the flexible substrate 110. The thin film encapsulation layer 130 seals the organic light emitting element 120 together with the flexible substrate 110. The thin film encapsulation layer 130 includes one or more organic layers provided on the organic light emitting element 120 and one or more inorganic layers provided on the organic light emitting element 120 (e.g., the thin film encapsulation layer 130 may be a stacked structure of organic and inorganic layers).

The protective film 200 is adhered to a bottom surface of the flexible display panel 100 (e.g., to a bottom surface of the flexible substrate 110). A thickness of the protective film 200 is greater than a thickness of the flexible display panel 100, and the protective film 200 protects the flexible display panel 100 from external interference. The protective film 200 includes the film main body 210, the first adhesion portion 220, and a second adhesion portion 230 (e.g., a second adhesive).

Figure 2:
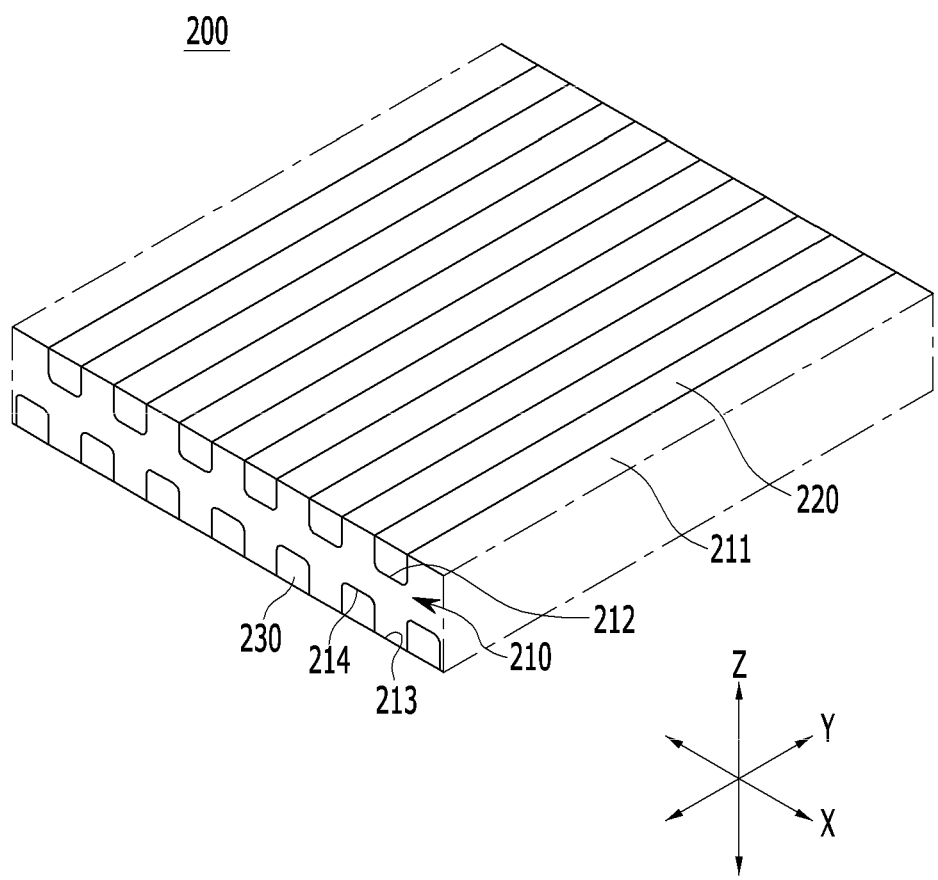
FIG. 2 is a perspective view of a part of a protective film shown in FIG. 1.

FIG. 2 is a perspective view of a part of the protective film shown in FIG. 1.

As shown in FIGS. 1 and 2, the film main body 210 includes the first surface 211, a first recess portion 212, a second surface 213, and a second recess portion 214.

The first surface 211 contacts the flexible display panel 100 (e.g., contacts the flexible substrate 110) but is not attached to (e.g., is not adhered to) the flexible display panel 100.

The first recess portion 212 is concave from the first surface 211. The first recess portion 212 may be concave in a third direction (e.g., the Z-axis direction in FIGS. 1 and 2), which is a thickness direction of the film main body 210, from the first surface 211. However, the present invention is not limited thereto, and the first recess portion 212 may be concave in various directions. A plurality of the first recess portions 212 may be provided in the film main body 210. The plurality of first recess portions 212 are disposed at a distance from each other (e.g., are spaced from each other) in a first direction (e.g., the X-axis direction in FIGS. 1 and 2) on the first surface 211 of the film main body 210. Each of the plurality of first recess portions 212 extends in a second direction (e.g., the Y-axis direction in FIGS. 1 and 2) that crosses the first direction on the first surface 211 of the film main body 210. The plurality of first recess portions 212 are formed in the shape of lines extending in the second direction (e.g., each of the first recess portions 212 has the shape of a line extending in the second direction). However, the present invention is not limited thereto, and the plurality of first recess portions 212 may have various suitable shapes. A plurality of the first adhesion portions 220 is provided such that one of the first adhesive portions 220 is in each of the plurality of first recess portions 212.

A cross-section of the first recess portion 212 in the third direction (Z) has a quadrangular shape, but the present invention is not limited thereto. For example, in other embodiments, the cross-section of the first recess portion 212 may have a triangular shape, a pentagonal shape, a hexagonal shape, a polygonal shape, a circular shape, or an oval shape.

In other exemplary embodiments, each of the plurality of first recess portions 212 may have a circular shape, an oval shape, a polygonal shape, a loop shape, a curved line shape, or the like on the first surface 211 (e.g., when viewed from above).

Further, in other exemplary embodiments, the first recess portion 212 may be formed as a single groove (e.g., a single, continuous groove) on the first surface 211, and the single first recess portion 212 may have various shapes on the first surface 211 of the film main body 210. For example, the first recess portion 212 may have a lattice shape or a plate shape.

The second surface 213 of the film main body 210 is opposite to the first surface 211. The second surface 213 is distanced from (e.g., is spaced from) the flexible display panel 100.

The second recess portion 214 is concave from the second surface 213. The second recess portion 214 may be concave in the third direction (Z), which is the thickness direction of the film main body 210, from the second surface 213. However, the present invention is not limited thereto, and the second recess portion 214 may be concave in various directions. A plurality of the second recess portions 214 may be provided in the film main body 210. The plurality of second recess portions 214 are disposed at a distance from each other (e.g., are spaced from each other) in the first direction (X) on the second surface 213 of the film main body 210. Each of the plurality of second recess portions 214 extends in the second direction (Y) that crosses the first direction (X) on the second surface 213 of the film main body 210. Each of the plurality of second recess portions 214 has a line shape that extends in the second direction (Y) on the second surface 213, but the present invention is not limited thereto. The second recess portions 214 may have various suitable shapes. A plurality of the second adhesion portions 230 is provided such that one of the second adhesion portions 230 is in each of the plurality of second recess portions 214.

A cross-section of the second recess portion 214 in the third direction (Z) has a quadrangular shape, but the present invention is not limited thereto. For example, in other embodiments, the cross-section of the second recess portion 214 may have a triangular shape, a pentagonal shape, a hexagonal shape, a polygonal shape, a circular shape, or an oval shape.

The second recess portion 214 partially overlaps the first recess portion 212 in the third direction (Z), which is the thickness direction of the film main body 210, but the present invention is not limited thereto. For example, the second recess portion 214 may not overlap the first recess portion 212 in the third direction (Z). In other embodiments, the second recess portion 214 may wholly or entirely overlap (e.g., may be aligned with) the first recess portion 212 in the third direction (Z).

In still other exemplary embodiments, each of the plurality of second recess portions 214 may have a circular shape, an oval shape, a polygonal shape, a loop shape, a curved line shape, or the like on the second surface 213.

Further, in other exemplary embodiments, the second recess portion 214 may be formed as a single groove (e.g., a single, continuous groove) on the second surface 213, and the single second recess portion 214 may have various suitable shapes on the second surface 213 of the film main body 210. For example, the second recess portion 214 may have a lattice shape or a plate shape.

The first adhesion portion 220 is provided in the first recess portion 212 of the film main body 210. The first adhesion portion 220 is provided between the flexible display panel 100 and the film main body 210 (e.g., between the flexible substrate 110 and the film main body 210). The first adhesion portion 220 is adhered to the flexible display panel 100 and the film main body 210, respectively, such that the flexible display panel 100 and the film main body 210 are bonded to each other. Accordingly, the protective film 200 is adhered to the flexible display panel 100 by the first adhesion portion 220. Thus, the first surface 211 is not adhered to the flexible display panel 100 while the first adhesion portion 220 of the protective film 200 is adhered to the flexible display panel 100. The first adhesion portion 220 has a smaller Young's modulus than that of the film main body 210.

A plurality of the first adhesion portions 220 may be provided. The plurality of first adhesion portions 220 are disposed at a distance from each other (e.g., are spaced from each other) in the first direction (X) on the first surface 211 of the film main body 210. The plurality of first adhesion portions 220 extend in the second direction (Y) that crosses the first direction (X) on the first surface 211 of the film main body 210. Each of the plurality of first adhesion portions 220 has a line shape that extends in the second direction (Y) or a rectangular shape on the first surface 211, but the present invention is not limited thereto. The first adhesion portions 220 may have various suitable shapes.

A cross-section of each of the first adhesion portions 220 in the third direction (Z) has a quadrangular shape, but the present invention is not limited thereto. For example, the cross-section of each of the first adhesion portions 220 may have a triangular shape, a pentagonal shape, a hexagonal shape, a polygonal shape, a circular shape, or an oval shape.

In other exemplary embodiments, each of the plurality of first adhesion portions 220 may have a circular shape, an oval shape, a polygonal shape, a loop shape, a curved line shape, or the like on the first surface 211.

In addition, in other exemplary embodiments, the first adhesion portion 220 may be provided as a single body (e.g., a single, continuous body) on the first surface 211, and the single first adhesion portion 220 may have various suitable shapes on the first surface 211 of the film main body 210. For example, the first adhesion portion 220 may have a lattice shape or a plate shape.

The second adhesion portion 230 is provided in the second recess portion 214 of the film main body 210. The second adhesion portion 230 has a smaller Young's modulus than that of the film main body 210.

A plurality of the second adhesion portions 230 may be provided. The plurality of second adhesion portions 230 are distanced from each other (e.g., spaced from each other) in the first direction (X) on the second surface 213 of the film main body 210. The plurality of second adhesion portions 230 extend in the second direction (Y) that crosses the first direction (X) on the second surface 213 of the film main body 210. Each of the plurality of second adhesion portions 230 has a line shape that extends in the second direction (Y), but the present invention is not limited thereto. The plurality of second adhesion portion 230 may have various suitable shapes.

A cross-section of each of the second adhesion portions 230 in the third direction (Z) has a quadrangular shape, but the present invention is not limited thereto. For example, the cross-section of each of the second adhesion portions 230 may have a triangular shape, a pentagonal shape, a hexagonal shape, a polygonal shape, a circular shape, or an oval shape.

The second adhesion portion 230 partially overlaps the first adhesion portion 220 in the third direction (Z), which is the thickness direction of the film main body 210, but the present invention is not limited thereto. For example, the second adhesion portion 230 may not overlap the first adhesion portion 220 in the third direction (Z). In other embodiments, the second adhesion portion 230 may wholly or entirely overlap (e.g., may be aligned with) the first adhesion portion 220 in the third direction (Z).

In other exemplary embodiments, each of the plurality of second adhesion portions 230 may have a circular shape, an oval shape, a polygonal shape, a loop shape, a curved line shape, or the like on the second surface 213.

In addition, in other exemplary embodiments, the second adhesion portion 230 may be provided as a single body (e.g., a single, continuous body) on the second surface 213, and the second adhesion portion 230 may have various suitable shapes on the second surface 213 of the film main body 210. For example, the second adhesion portion 230 may have a lattice shape or a plate shape.

Referring back to FIG. 1, the polarizer 300 is disposed on the flexible display panel 100. For example, the polarizer 300 is disposed on the protective film 200 such that the flexible display panel 100 is interposed therebetween. The polarizer 300 may include a phase retardation plate and a linear polarizer that suppresses reflection of external light from the flexible display panel 100, but the present invention is not limited thereto. The polarizer 300 may include various known, suitable optical plates.

The window 400 is provided on the polarizer 300. The window 400 may protect the flexible display panel 100 from external interference, and a touch sensing portion (e.g., a touch panel) that senses touch may be provided in or on a front side and/or a bottom side of the window 400. In other embodiments, the touch sensor may be provided in or on the flexible display panel 100.

The first adhesive layer 500 is provided between the flexible display panel 100 and the polarizer 300. The first adhesive layer 500 respectively contacts the flexible display panel 100 and the polarizer 300 and bonds the flexible display panel 100 and the polarizer 300 to each other.

The second adhesive layer 600 is provided between the polarizer 300 and the window 400. The second adhesive layer 600 respectively contacts the polarizer 300 and the window 400 and bonds the polarizer 300 and the window 400 to each other.

Hereinafter, additional aspects and features of the display device according to the above-described exemplary embodiment will be described with reference to FIG. 3.

Figure 3:
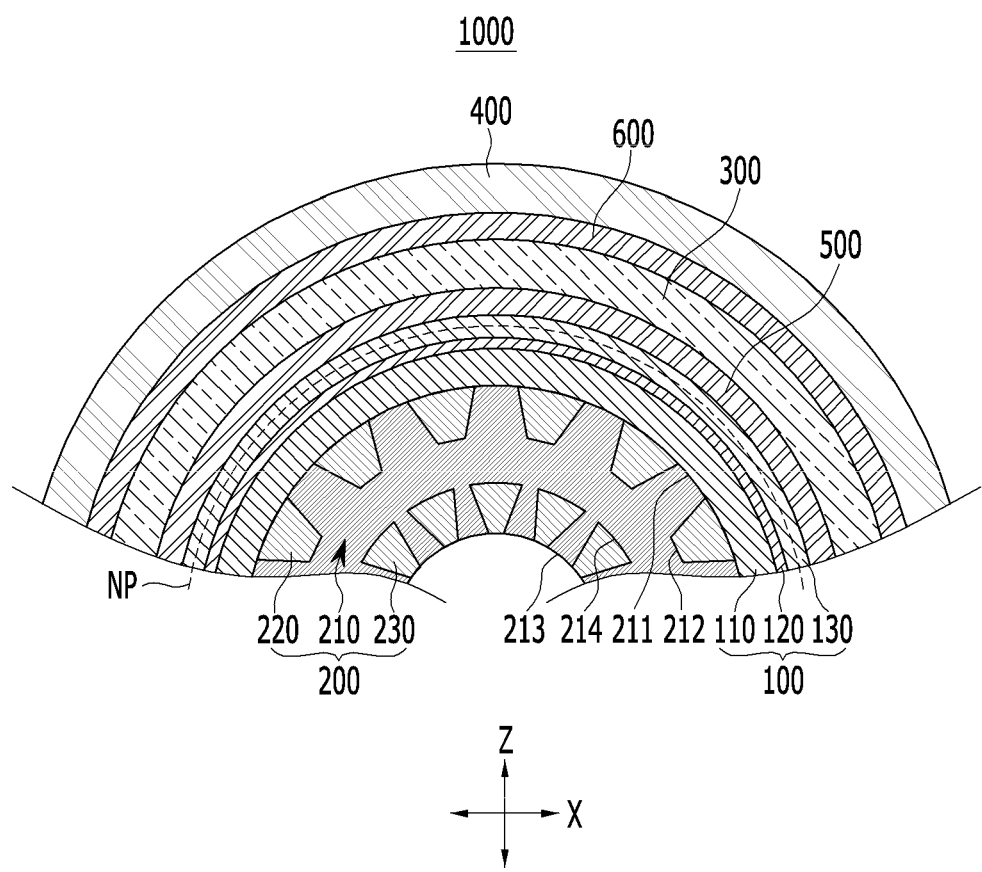
FIG. 3 is a cross-sectional view of the display device shown in FIG. 1 in a bent state.

FIG. 3 is a cross-sectional view of the display device shown in FIG. 1 in a bent state.

As shown in FIG. 3, the display device 1000 that includes the flexible display panel 100, the protective film 200, the polarizer 300, the window 400, the first adhesive layer 500, and the second adhesive layer 600 is bent in the first direction (X). For example, the flexible display panel 100, the protective film 200, the polarizer 300, the window 400, the first adhesive layer 500, and the second adhesive layer 600 are bent in the first direction (X).

In the display device 1000 according to the present exemplary embodiment, the protective film 200 includes the plurality of first recess portions 212 and the plurality of second recess portion 214 that are arranged in the first direction (X), which is the bending direction of the display device 1000. When the protective film 200 is bent in the first direction (X) such that a stress is applied to the protective film 200, the plurality of first recess portions 212 and the plurality of second recess portions 214 are deformed due to the stress, thereby reducing or minimizing the stress applied to the protective film 200.

Further, in the display device 1000 according to the present exemplary embodiment, the protective film 200 includes the plurality of first adhesion portions 220 and the plurality of second adhesion portions 230 that are arranged in the first direction (X), which is the bending direction of the display device 1000. The plurality of first adhesion portions 220 and the plurality of second adhesion portions 230 have a smaller Young's modulus than that of the film main body 210. Thus, when the protective film 200 is bent in the first direction (X) such that a stress is applied to the protective film 200, the plurality of first adhesion portions 220, the plurality of first recess portions 212, the plurality of second recess portions 214, and the plurality of second adhesion portions 230 are deformed due to the stress, thereby reducing or minimizing the stress applied to the protective film 200.

In addition, a thickness of the protective film 200 of the display device 1000 according to the present exemplary embodiment is relatively thin at where the plurality of first recess portions 212 and the plurality of second recess portions 214 are arranged, and accordingly, the protective film 200 may be easily bent by a relatively low force.

Further, the plurality of first adhesion portions 220 and the plurality of second adhesion portions 230 of the protective film 200 of the display device 1000 according to the present exemplary embodiment have a smaller Young's modulus than that of the film main body 210, and accordingly, the protective film 200 may be easily bent by the relatively low force.

For example, although the flexible display panel 100 of the display device 1000 according to the exemplary embodiment includes the protective film 200 for protection, the protective film 200 may be easily bent and the stress applied to the protective film 200 is reduced or minimized. Accordingly, flexibility of the display device 1000 may be improved even though the display device 1000 includes the protective film 200.

In addition, in the display device 1000 according to the present exemplary embodiment, the first surface 211 of the film main body 210 of the protective film 200 contacts the flexible display panel 100 while not being bonded (e.g., not directly bonded or adhered) with the flexible display panel 100, and accordingly, a location of a neutral plane NP of the flexible display panel 100 may be controlled (e.g., may be selectively varied) by adjusting a Young's modulus of the film main body 210 and a thickness of the protective film 200.

For example, in a conventional display device, a conventional plate-shaped adhesion layer is provided between a flexible display panel and a protective film (e.g., the conventional protective film does not include recess portions such that the conventional plate-shaped adhesion layer is on an upper surface of the protective film). Because the plate-shaped adhesion layer of the display device has a smaller Young's modulus than that of each of the flexible display panel and the protective film, when the display device is bent, different neutral planes respectively occur in the flexible display panel that is disposed at an upper side of the plate-shaped adhesion layer and in the protective film that is disposed at a lower side of the plate-shaped adhesion layer. Thus, in such a case, it is difficult to adjust the location of the neutral plane in the flexible display panel, and adjusting a thickness of the protective film may not be sufficient to adequately adjust the location of the neutral plane in the flexible display panel.

However, in the display device 1000 according to the present exemplary embodiment, the protective film 200 contacts the flexible display panel 100 while the first surface 211 is not bonded to the flexible display panel 100 and a plate-shape adhesion layer is not provided between the protective film 200 and the flexible display panel 100.

Because the protective film 200 of the display device 1000 according to the present exemplary embodiment directly contacts the flexible display panel 100, when the display device 1000 is bent, a single neutral plane NP occurs in both the protective film 200 and the flexible display panel 100 (e.g., a single neutral plane NP occurs in one layer that is formed by a combination of the protective film 200 and the flexible display panel 100). Thus, the location of the neutral plane NP may be moved in the flexible display panel 100 by adjusting the Young's modulus of the film main body 210 of the protective film 200 and the thickness of the protective film 200.

For example, the neutral plane NP formed in both the protective film 200 and the flexible display panel 100 may be moved toward the flexible display panel 100 by reducing the thickness of the protective film 200. In addition, the neutral plane NP formed in both the protective film 200 and the flexible display panel 100 may be moved toward the flexible display panel 100 by reducing the Young's modulus of the film main body 210 of the protective film 200. When the neutral plane NP occurs in the flexible display panel 100 when the display device 1000 is bent, a stress applied to the flexible display panel 100 may be reduced or suppressed.

For example, according to exemplary embodiments, the location of the neutral plane NP in the display device 1000 may be controlled by varying the protective film 200.

Hereinafter, other exemplary embodiments of the protective film of the display device shown in FIG. 1 will be described with reference to FIGS. 4A-4C.

Figure 4A:
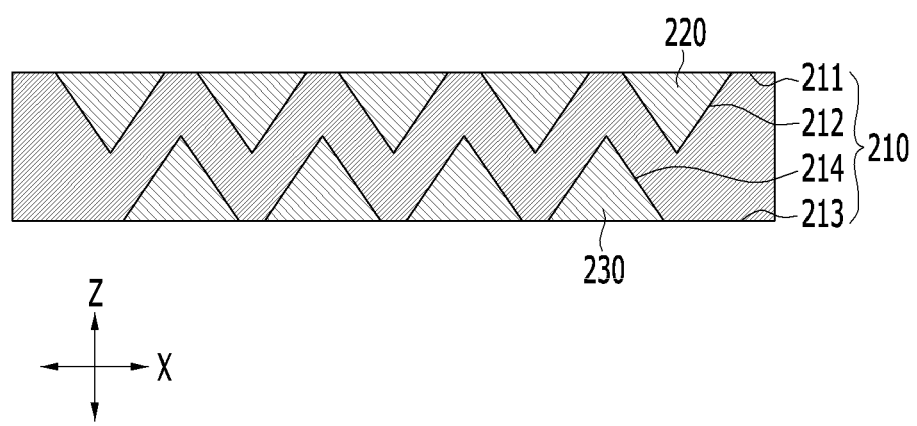
FIG. 4A is a cross-sectional view of another exemplary embodiment of the protective film of the display device shown in FIG. 1.

FIG. 4A is a cross-sectional view of another embodiment of the protective film of the display device shown in FIG. 1.

As shown in FIG. 4A, a protective film includes the film main body 210, the first adhesion portions 220, and the second adhesion portions 230.

The plurality of first recess portions 212 and the plurality of second recess portions 214 that are arranged in a first direction (X) may respectively have the triangular-shaped cross-sections in a third direction (Z).

Further, the plurality of first adhesion portions 220 and the plurality of second adhesion portions 230 that are arranged in the first direction (X) may respectively have the triangular-shaped cross-sections in the third direction (Z).

Figure 4B:
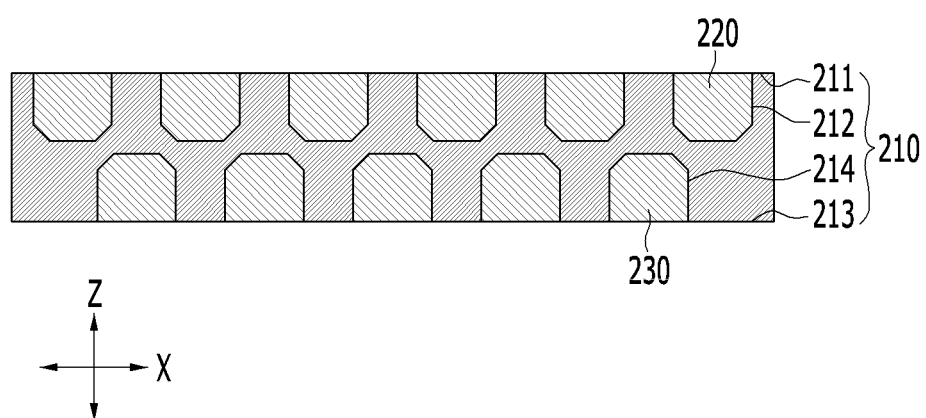
FIG. 4B is a cross-sectional view of another exemplary embodiment of the protective film of the display device shown in FIG. 1.

FIG. 4B is a cross-sectional view of another embodiment of the protective film of the display device shown in FIG. 1.

As shown in FIG. 4B, a protective film includes the film main body 210, the first adhesion portions 220, and the second adhesion portions 230.

The plurality of first recess portions 212 and the plurality of second recess portions 214 that are arranged in a first direction (X) may respectively have the hexagonal-shaped cross-sections in a third direction (Z).

In addition, the plurality of first adhesion portions 220 and the plurality of second adhesion portions 230 that are arranged in the first direction (X) may respectively have the hexagonal-shaped cross-sections in the third direction (Z).

Figure 4C:
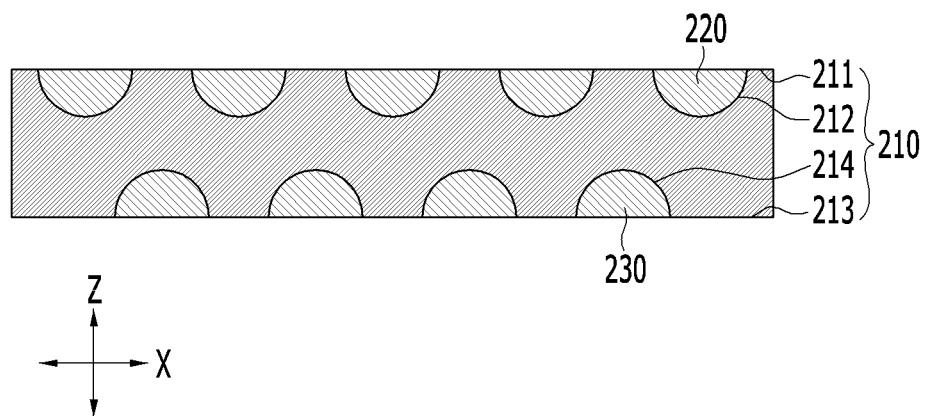
FIG. 4C is a cross-sectional view of another exemplary embodiment of the protective film of the display device shown in FIG. 1.

FIG. 4C is a cross-sectional view of another embodiment of the protective film of the display device shown in FIG. 1.

As shown in FIG. 4C, a protective film includes the film main body 210, the first adhesion portions 220, and the second adhesion portions 230.

The plurality of first recess portions 212 and the plurality of second recess portions 214 that are arranged in a first direction (X) may respectively have semicircular-shaped cross-sections (e.g., partial circular shaped cross-sections) in a third direction (Z).

In addition, the plurality of first adhesion portions 220 and the plurality of second adhesion portions 230 that are arranged in the first direction (X) may respectively have semicircular-shaped cross-sections.

While the present invention has been described in connection with what are presently considered to be practical exemplary embodiments, it is to be understood that the present invention is not limited to the disclosed embodiments but is intended to cover various modifications and equivalent arrangements included within the spirit and scope of the appended claims and their equivalents.

What is claimed is:

1. A display device comprising:
   a flexible display panel having a bendable portion, the flexible display panel comprising:
      a flexible substrate having a first surface and a second surface opposite the first surface; and
      light emitting elements on and over the first surface of the flexible substrate and closer to the first surface of the flexible substrate than to the second surface of the flexible substrate;
   a protective film having a first surface facing the bendable portion, a second surface opposite the first surface, and a plurality of first recesses recessed from the first surface, the plurality of first recesses overlapping the bendable portion and being spaced from each other; and
   a first adhesion portion located in the plurality of first recesses and between the bendable portion and the plurality of first recesses, the first adhesion portion contacting the second surface of the flexible substrate.

2. The display device of claim 1, wherein the first adhesion portion attaches the protective film to the bendable portion.

3. The display device of claim 1, wherein the first adhesion portion is in contact with the bendable portion and the protective film.

4. The display device of claim 1, wherein the first adhesion portion is filled in the plurality of first recesses.

5. The display device of claim 1, wherein the first adhesion portion has a smaller Young's modulus than that of the protective film.

6. The display device of claim 1, wherein the plurality of first recesses are spaced from each other in a first direction that corresponds to a bending direction of the bendable portion.

7. The display device of claim 6, wherein each of the plurality of first recesses extends in a second direction that crosses the first direction.

8. The display device of claim 1, wherein a plurality of second recesses is recessed from the second surface of the protective film, and
   wherein the display device further comprises a second adhesion portion located in the plurality of second recesses.

9. The display device of claim 8, wherein the second adhesion portion has a smaller Young's modulus than that of the protective film.

10. The display device of claim 9, wherein the plurality of second recesses are spaced from each other in a first direction.

11. The display device of claim 10, wherein each of the plurality of second recesses extends in a second direction that crosses the first direction.

12. The display device of claim 8, wherein the plurality of second recesses at least partially overlaps with the plurality of first recesses in a thickness direction of the protective film.

13. The display device of claim 8, wherein a cross-section of at least one of the plurality of second recesses has a triangular shape, a quadrangular shape, a hexagonal shape, a polygonal shape, a circular shape, or an oval shape.

14. The display device of claim 1, wherein a cross-section of at least one of the plurality of first recesses has a triangular shape, a quadrangular shape, a hexagonal shape, a polygonal shape, a circular shape, or an oval shape.

15. The display device of claim 1, wherein a thickness of the protective film is greater than a thickness of the flexible display panel.

16. The display device of claim 1, wherein the flexible display panel further comprises a thin film encapsulation layer covering the light emitting elements and on the first surface of the flexible substrate.

17. The display device of claim 1, wherein the flexible substrate is between the light emitting elements and the protective film.

18. The display device of claim 1, wherein the first surface of the flexible substrate faces the light emitting elements, and
   wherein the second surface of the flexible substrate faces the protective film.

* * * * *